United States Patent
Park

(10) Patent No.: US 10,872,669 B2
(45) Date of Patent: Dec. 22, 2020

(54) SEMICONDUCTOR DEVICE AND A MANUFACTURING METHOD OF THE SEMICONDUCTOR DEVICE

(71) Applicant: SK hynix Inc., Icheon-si (KR)

(72) Inventor: Eun Young Park, Cheongju-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/509,864

(22) Filed: Jul. 12, 2019

(65) Prior Publication Data

US 2020/0202940 A1    Jun. 25, 2020

(30) Foreign Application Priority Data

Dec. 21, 2018 (KR) .................. 10-2018-0167799

(51) Int. Cl.
| | |
|---|---|
| *G11C 16/04* | (2006.01) |
| *G11C 16/10* | (2006.01) |
| *G11C 16/14* | (2006.01) |
| *G11C 16/26* | (2006.01) |
| *G11C 16/34* | (2006.01) |
| *H01L 27/11582* | (2017.01) |
| *H01L 27/11524* | (2017.01) |
| *H01L 27/1157* | (2017.01) |
| *H01L 27/11556* | (2017.01) |

(52) U.S. Cl.
CPC .......... *G11C 16/10* (2013.01); *G11C 16/0483* (2013.01); *G11C 16/14* (2013.01); *G11C 16/26* (2013.01); *G11C 16/3459* (2013.01); *H01L 27/1157* (2013.01); *H01L 27/11524* (2013.01); *H01L 27/11556* (2013.01); *H01L 27/11582* (2013.01)

(58) Field of Classification Search
CPC ..... G11C 16/0483; G11C 16/14; G11C 16/10; G11C 16/26; G11C 16/3459
See application file for complete search history.

(56) References Cited

U.S. PATENT DOCUMENTS

| | | | |
|---|---|---|---|
| 2014/0334230 A1* | 11/2014 | Kwon, II | ......... H01L 27/11582 365/185.11 |
| 2016/0141011 A1 | 5/2016 | Lee | |
| 2016/0260483 A1 | 9/2016 | Shano et al. | |
| 2017/0213843 A1 | 7/2017 | Choi | |
| 2018/0218774 A1 | 8/2018 | Kimura | |
| 2020/0203180 A1 | 6/2020 | Sonehara et al. | |

FOREIGN PATENT DOCUMENTS

KR    1020130050589 A    5/2013

\* cited by examiner

*Primary Examiner* — Jay W. Radke
(74) *Attorney, Agent, or Firm* — William Park & Associates Ltd.

(57) ABSTRACT

A semiconductor device includes a bit line, a source line, and a memory string coupled between the bit line and the source line. The memory string includes at least one drain select transistor, a plurality of memory cells, at least one source select transistor, and a dummy transistor coupled between the bit line and the drain select transistor or between the source line and the source select transistor.

18 Claims, 13 Drawing Sheets

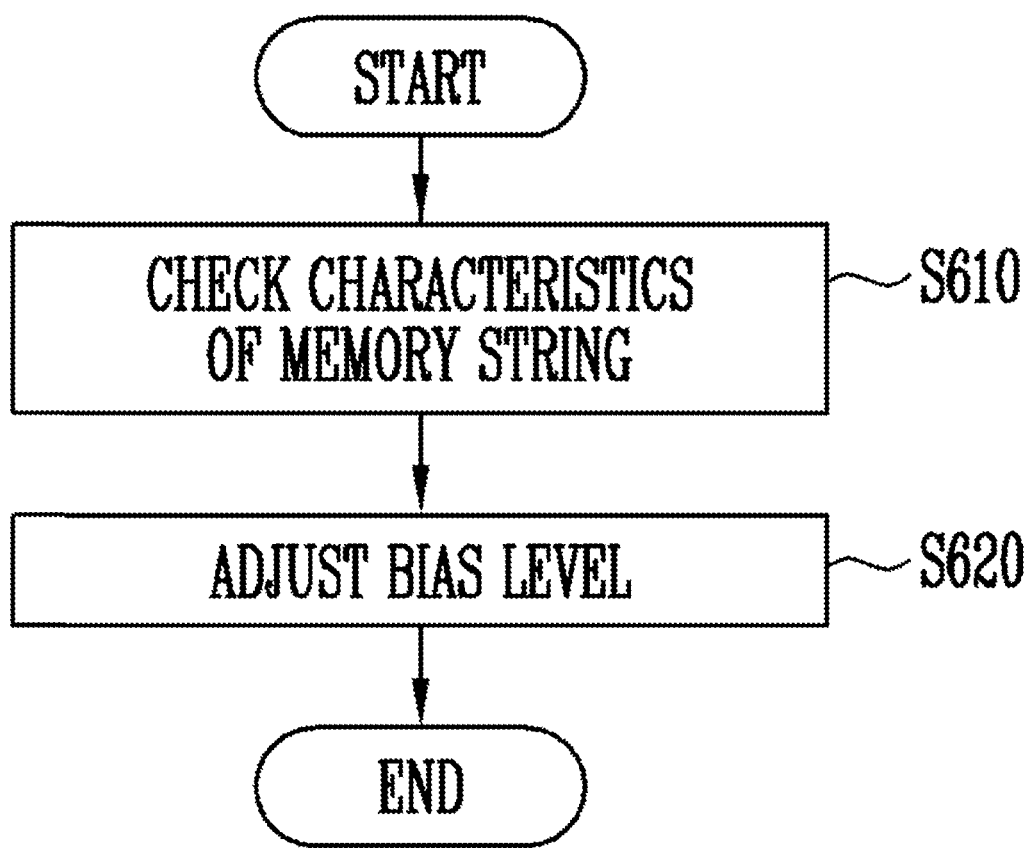

SEMICONDUCTOR DEVICE AND A MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2018-0167799, filed on Dec. 21, 2018, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a method of manufacturing the semiconductor device.

2. Related Art

Semiconductor memory devices are storage devices made of semiconductor materials such as silicon (Si), germanium (Ge), gallium arsenide (GaAs), and indium phosphide (InP). Semiconductor memory devices are classified as volatile memory devices or nonvolatile memory devices.

Volatile memory devices lose stored data when power is discontinued. Examples of volatile memory devices include Static RAM (SRAM), Dynamic RAM (DRAM) and Synchronous DRAM (SDRAM). Nonvolatile memory devices retain stored data independent of the availability of power. Examples of nonvolatile memory devices include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), and Ferroelectric RAM (FRAM). Flash memory may be generally classified into NOR-type memory or NAND-type memory.

SUMMARY

Various embodiments are directed to a semiconductor device with improved operational characteristics and a manufacturing method of the semiconductor device.

According to an embodiment, a semiconductor device includes a bit line, a source line, a plurality of memory strings coupled between the bit line and the source line. Each of the memory strings includes at least one drain select transistor, a plurality of memory cells, at least one source select transistor, and a dummy transistor coupled between the bit line and the drain select transistor or between the source line and the source select transistor. The semiconductor device also includes a peripheral circuit configured to perform an erase operation, a program operation or a read operation on the memory strings by applying bias to dummy lines coupled to dummy transistors of the memory strings, and a control logic configured to control the peripheral circuit.

According to an embodiment, a semiconductor device includes stacked structures each including word lines, at least one select line stacked over the word lines, and at least one dummy line stacked over the select line. The semiconductor device also includes openings passing through the stacked structures, channel layers formed in the openings, and pads formed in the openings, wherein the pads are coupled to the channel layers. The semiconductor device also includes a peripheral circuit configured to apply bias to dummy lines during an erase operation, a program operation, or a read operation. The semiconductor device also includes a control logic configured to control the peripheral circuit such that the bias varies depending on heights of the pads.

According to an embodiment, a method of manufacturing a semiconductor device includes forming a stacked structure, forming an opening passing through the stacked structure, forming a channel layer in the opening, and forming a pad in the opening, wherein the pad is coupled to the channel layer. The method also includes adjusting a condition of bias used for an erase operation, a program operation, or a read operation depending on a height of the pad.

BRIEF DESCRIPTION OF THE DRAWINGS

FIG. 6 is a flowchart illustrating a method of adjusting bias of a semiconductor device, according to an embodiment.

DETAILED DESCRIPTION

Hereinafter, various examples of embodiments are described in detail with reference to the accompanying drawings. In the following description, an explanation of related functions and constitutions may be omitted for simplicity and conciseness. In addition, they may be embodied in different forms and should not be construed as limited to the embodiments set forth herein. Rather, these embodiments are provided so that this disclosure will be enabling to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Figure 1:
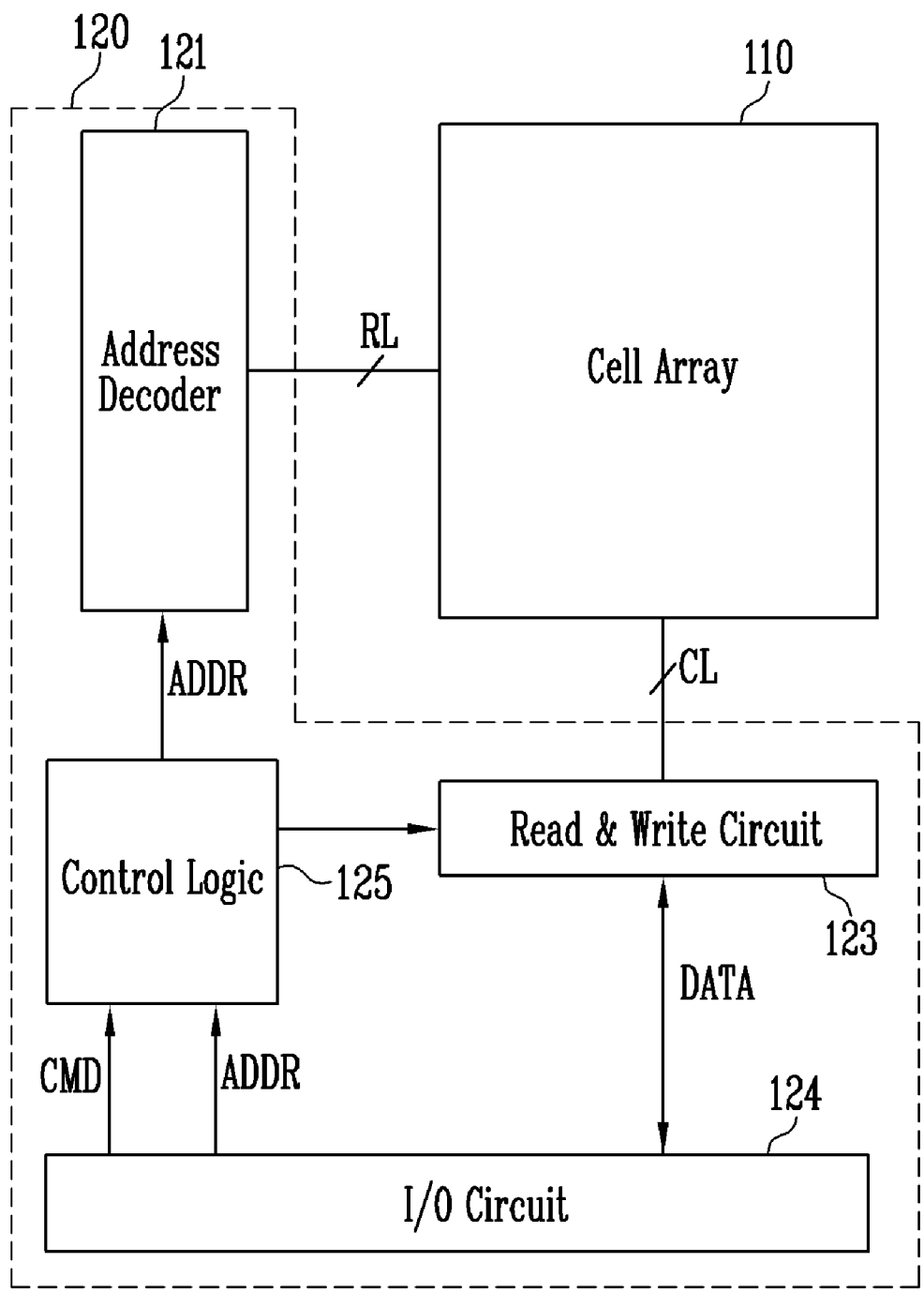
FIG. 1 is a block diagram illustrating a configuration of a semiconductor device, according to an embodiment.

FIG. 1 is a block diagram illustrating a configuration of a semiconductor device 100, according to an embodiment.

Referring to FIG. 1, the semiconductor device 100 may include a cell array 110 and a peripheral circuit 120.

The cell array 110 may be coupled to an address decoder 121 through row lines RL and to a read and write circuit 123 through column lines CL. The row lines RL may be word lines, and the column lines CL may be bit lines. However, the terms "word lines" and "bit lines" may be relative to each other. In other embodiments, the row lines may be the bit lines, and the column lines may be the word lines.

The cell array 110 may include a plurality of memory strings, and the plurality of memory strings may be arranged in a horizontal direction or a vertical direction to a substrate. Each of the memory strings may include a dummy transistor and the cell array may include dummy lines coupled to the dummy transistor of each of the memory strings. In addition, the cell array 110 may include a plurality of memory blocks, and each of the plurality of memory blocks may include a plurality of pages. For example, the semiconductor device 100 may perform an erase operation in units of memory blocks and a program operation or a read operation in units of pages.

The peripheral circuit 120 may include the address decoder 121, the read and write circuit 123, an input/output circuit 124, and a control logic 125.

The control logic 125 may be coupled to the address decoder 121, the read and write circuit 123, and the input/output circuit 124. The control logic 125 may receive a command CMD and an address ADDR from the input/output circuit 124 and control the address decoder 121 and the read and write circuit 123 to perform an internal operation in response to the received command CMD.

The address decoder 121 may be coupled to the cell array 110 through the row lines RL. For example, the address decoder 121 may be coupled to the cell array 110 through the word lines, a dummy line, a source select line, and a drain select line. In addition, the address decoder 121 may be controlled by the control logic 125 and configured to control the row lines RL. Therefore, the address decoder 121 may receive the address ADDR from the control logic 125 and select one of the memory blocks of the cell array 110 in response to the received address ADDR.

A program operation and a read operation of the semiconductor device 100 may be performed in units of pages. Therefore, during the program operation and the read operation, the address ADDR may include a block address and a row address. The address decoder 121 may decode the block address included in the received address ADDR and select one of the memory blocks according to the decoded block address. The address decoder 121 may decode the row address included in the received address ADDR and select one of the pages of the selected memory block according to the decoded row address.

An erase operation of the semiconductor device 100 may be performed in units of memory blocks. Therefore, during the erase operation, the address ADDR may include a block address. The address decoder 121 may decode the block address, and select one of the memory blocks in response to the decoded block address.

The read and write circuit 123 may be coupled to the cell array 110 through the column lines CL. During a program operation, the read and write circuit 123 may transfer data DATA received from the input/output circuit 124 to the column lines CL, and memory cells of the selected page may be programmed with the transferred data DATA. The data DATA may be multi-bit data to be programmed to memory cells, respectively. In addition, the memory cells may be programmed by a Single Level Cell (SLC) method or a Multi Level Cell (MLC) method.

During a read operation, the read and write circuit 123 may read the data DATA from the memory cells of the selected page through the column lines CL and output the read data DATA to the input/output circuit 124. During an erase operation, the read and write circuit 123 may float the column lines CL. A program operation and an erase operation may include a verify operation, and the verify operation may be similarly performed to the read operation. Thus, the peripheral circuit 120 may be configured to perform an erase operation, a program operation or a read operation on the memory strings by applying bias to the dummy lines coupled to the dummy transistors of the memory strings. In addition, the control logic 125 may be configured to control the peripheral circuit 120 such that the bias varies according to threshold voltages of the dummy transistors. Alternatively, the control logic 125 may be configured to control the peripheral circuit 120 such that the bias varies according to junction overlaps of channel structures included in the memory strings.

Figure 2A:
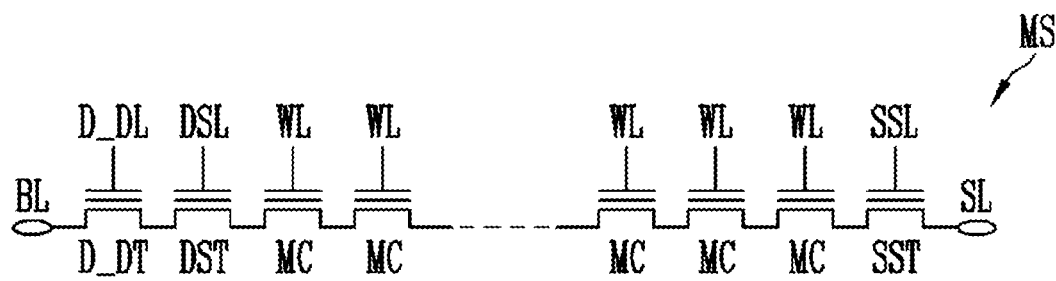
FIGS. 2A to 2C are circuit diagrams illustrating memory strings of a semiconductor device, according to embodiments.
Figure 2B:
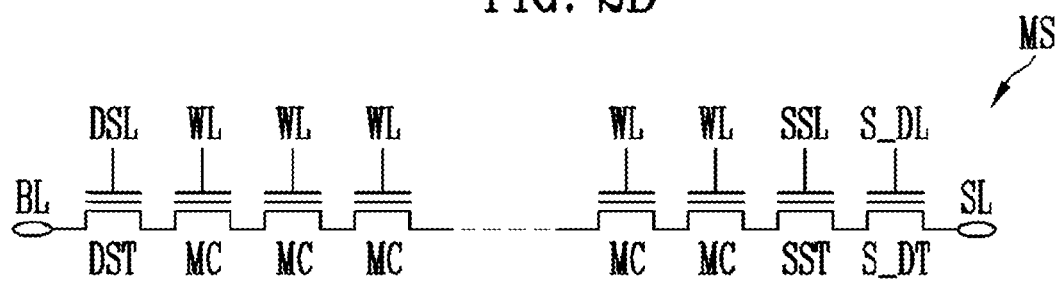
Figure 2C:
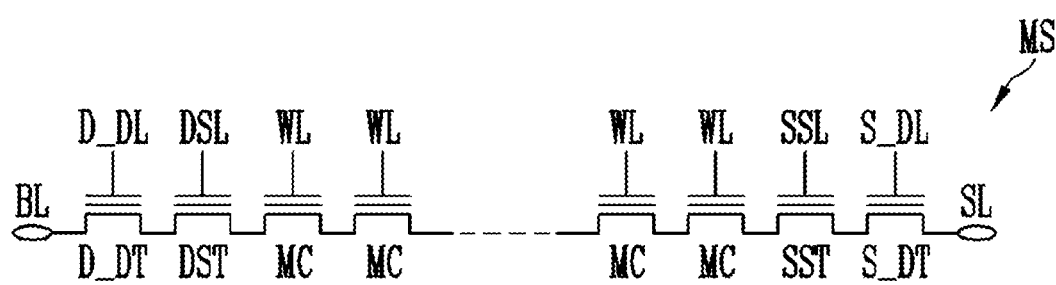

FIGS. 2A to 2C are circuit diagrams illustrating memory strings MS of a semiconductor device, according to different embodiments.

Referring to FIGS. 2A to 2C, the memory string MS may be coupled between a bit line BL and a source line SL. The memory string MS may include at least one drain select transistor DST, a plurality of memory cells MC, and at least one source select transistor SST. In addition, the memory string MS may further include a dummy transistor D_DT or S_DT coupled between the bit line BL and the drain select transistor DST or between the source line SL and the source select transistor SST.

Referring to FIG. 2A, the memory string MS may include the drain-side dummy transistor D_DT, at least one drain select transistor DST, the plurality of memory cells MC, and at least one source select transistor SST coupled in series with each other. Referring to FIG. 2B, the memory string MS may include at least one drain select transistor DST, the plurality of memory cells MC, at least one source select transistor SST, and the source-side dummy transistor S_DT coupled in series with each other. In addition, referring to FIG. 2C, the memory string MS may include the drain-side dummy transistor D_DT, at least one drain select transistor DST, the plurality of memory cells MC, at least one source select transistor SST, and at least one source-side dummy transistor S_DT coupled in series with each other. The number of drain-side dummy transistors D_DT included in one memory string MS may be the same as or different from the number of source-side dummy transistors S_DT.

A gate electrode of the memory cell MC may be coupled to a word line WL. A word line voltage (such as a program voltage, a pass voltage, and a read voltage) necessary for drive may be applied to the word line WL. A gate electrode of the drain-side dummy transistor D_DT may be coupled to a drain-side dummy line D_DL. A gate electrode of the source-side dummy transistor S_DT may be coupled to a source-side dummy line S_DL. Voltages (such as a program voltage, a pass voltage, a read voltage, and a ground voltage) necessary for drive may be applied to each of the dummy lines D_DL and S_DL. A gate electrode of the drain select transistor DST may be coupled to a drain select line DSL. A gate electrode of the source select transistor SST may be coupled to a source select line SSL.

According to the structure as described above, the drain-side dummy transistor D_DT may be located between the bit line BL and the drain select transistor DST. In other words, a transistor adjacent to the bit line BL may serve as a dummy transistor. Accordingly, the drain-side dummy transistor D_DT may serve as a buffer when the drain select transistor DST controls coupling between the memory string MS and the bit line BL.

The source-side dummy transistor S_DT may be located between the source line SL and the source select transistor SST. In other words, a transistor adjacent to the source line SL may serve as a dummy transistor. Accordingly, the source-side dummy transistor S_DT may serve as a buffer when the source select transistor SST controls coupling between the memory string MS and the source line SL.

In addition, the cell array may include a plurality of memory blocks, and each memory block may include the plurality of memory strings MS. The memory strings MS may have different physical structures, such as a height of a pad and a junction overlap of a channel structure from each other. In addition, difference in electrical characteristics such as a threshold voltage may be induced by difference in physical structure. For example, a first memory string having a first physical structure and a second memory string having a second physical structure different from the first physical structure may be included in the same memory block. Alternatively, the first memory string and the second memory string may be included in different memory blocks, respectively. Accordingly, an embodiment provides a measure to compensate for the difference in electrical characteristics due to the difference in physical structure of memory strings.

According to an embodiment, when an erase operation, a program operation, or a read operation is performed, the control logic 125 may control the address decoder 121 and the read and write circuit 123 such that bias levels vary in accordance with the difference in physical structure. Accordingly, even when the dummy transistors D_DT and S_DT have different threshold voltages, uniform operational characteristics may be provided.

Thereby, operational characteristics of a semiconductor device may be improved and reliability of data may be increased.

Figure 3:
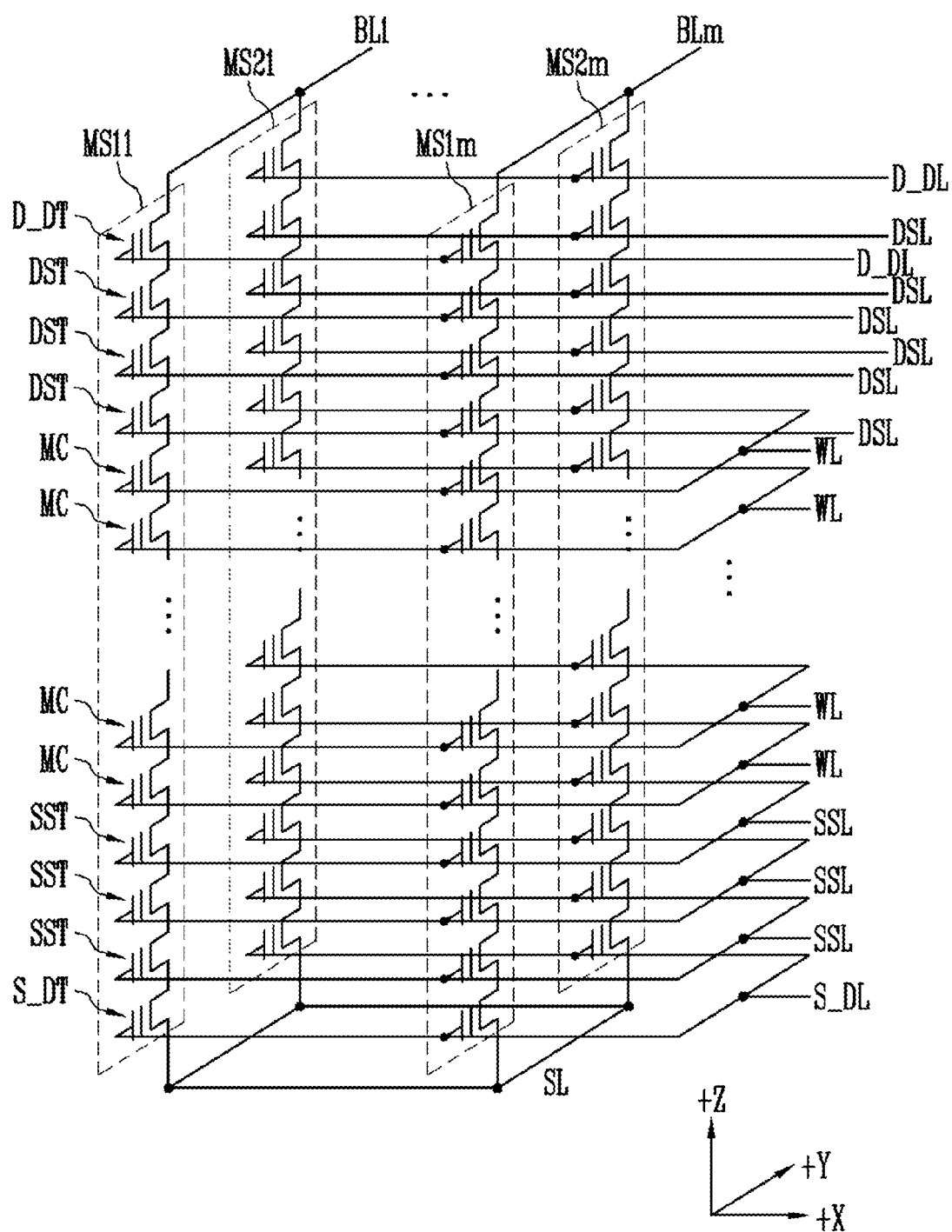
FIG. 3 illustrates memory strings arranged in three dimensions, according to an embodiment.

FIG. 3 illustrates an embodiment in which the memory strings MS, according to an embodiment, are arranged in three dimensions. A cell array may include a plurality of memory blocks BLK, and each of the memory blocks BLK may include the memory cells MC arranged in three dimensions.

Referring to FIG. 3, the memory block BLK may include a plurality of memory strings MS11 to MS1*m* and MS21 to MS2*m* coupled between the bit lines BL1 to BLm and the source line SL. Each of the memory strings MS11 to MS1*m* and MS21 to MS2*m* may extend in a +Z direction. The +Z direction may be a direction in which the memory cells MC are stacked. Here, m may be an integer of 2 or more.

Each of the memory strings MS11 to MS1*m* and MS21 to MS2*m* may include at least one source select transistor SST, the plurality of memory cells MC, and at least one drain select transistor DST, which are sequentially stacked on each other. In addition, each of the memory strings MS11 to MS1*m* and MS21 to MS2*m* may further include at least one drain-side dummy transistor D_DT coupled between the bit lines BL1 to BLm and the drain select transistor DST, at least one source-side dummy transistor S_DT coupled between the source line SL and the source select transistor SST, or the drain-side dummy transistor D_DT and the source-side dummy transistor S_DT. The number, the location, and the like of the dummy transistors D_DT and S_DT included in each of the memory strings MS11 to MS1*m* and MS21 to MS2*m* may be changed. For example, the number of drain-side dummy transistors D_DT and the number of source-side dummy transistors S_DT included in one of the memory strings MS11 to MS1*m* and MS21 to MS2*m* may be the same as or different from each other.

At least one source-side dummy transistor S_DT included in one of the memory strings MS11 to MS1*m* and MS21 to MS2*m* may be coupled between the source select transistor SST and the source line SL in series. In addition, the source-side dummy transistors S_DT located at the same level may be coupled to the same source-side dummy line S_DL.

At least one drain-side dummy transistor D_DT included in one of the memory strings MS11 to MS1*m* and MS21 to MS2*m* may be coupled between the drain select transistor DST and the bit line BL in series. In addition, the drain-side dummy transistors D_DT located at the same level may be coupled to the same drain-side dummy line D_DL.

The memory cells MC included in one of the memory strings MS11 to MS1*m* and MS21 to MS2*m* may be coupled between the source select transistor SST and the drain select transistor DST in series. In addition, the memory cells MC at the same level may be coupled to the same word line WL.

The source select transistors SST included in one of the memory strings MS11 to MS1*m* and MS21 to MS2*m* may be coupled between the source-side dummy transistor S_DT and the memory cell MC in series. In addition, the source select transistors SST at the same level may be coupled to the same source select line SSL.

The drain select transistors DST included in one of the memory strings MS11 to MS1*m* and MS21 to MS2*m* may be coupled between the drain-side dummy transistor D_DT and the memory cell MC in series. The drain select transistors DST at the same level among the drain select transistors DST of the memory strings MS11 to MS1*m* and MS21 to MS2*m* that are arranged in the same row (in a +X direction) may be coupled to the same drain select line DSL. In addition, the drain select transistors DST arranged in different rows (in the +X direction) may be coupled to the different drain select lines DSL from each other.

Figure 4:
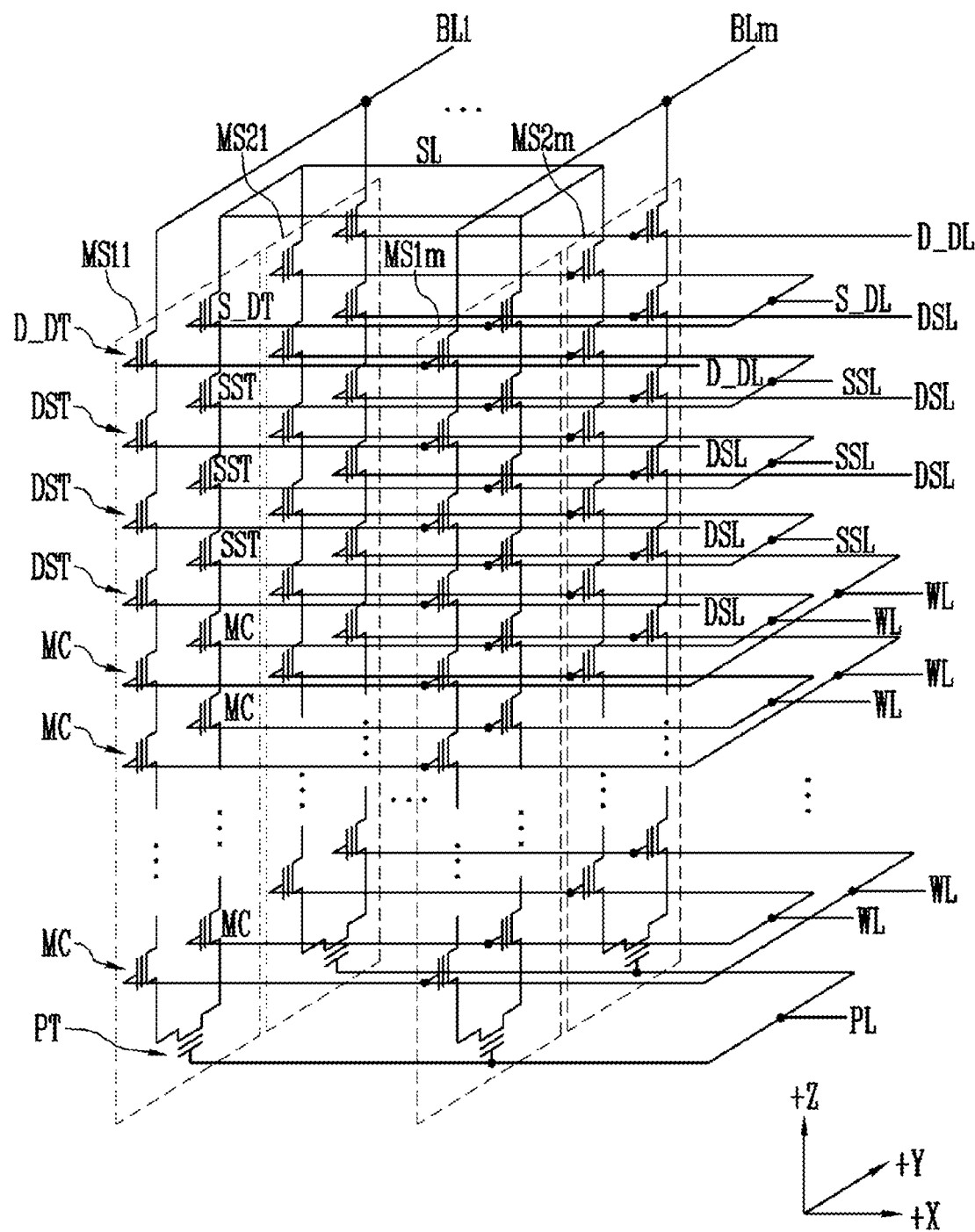
FIG. 4 illustrates memory strings arranged in three dimensions, according to an embodiment.

FIG. 4 illustrates an embodiment in which the memory strings MS, according to an embodiment, are arranged in three dimensions. A cell array may include the plurality of memory blocks BLK, and each of the memory blocks BLK may include the memory cells MC arranged in three dimensions.

Referring to FIG. 4, the memory block BLK may include the plurality of memory strings MS11 to MS1*m* and MS21 to MS2*m*. Each of the memory strings MS11 to MS1*m* and MS21 to MS2*m* may include at least one source-side dummy transistor S_DT, at least one source select transistor SST, the plurality of memory cells MC, at least one pipe transistor PT, the plurality of memory cells MC, at least one drain select transistor DST, and at least one drain-side dummy transistor D_DT coupled to each other in series. Each of the memory strings MS11 to MS1*m* and MS21 to MS2*m* may be arranged in the shape of a "U."

The pipe transistor PT may couple the memory cells MC of the drain-side and the memory cells MC of the source-side. In addition, a gate of the pipe transistor PT of each of the memory strings MS11 to MS1*m* and MS21 to MS2*m* may be coupled to a pipe line PL.

Structures other than the structures described above with reference to FIG. 4 are similar to the structures as described above with reference to FIG. 3. Therefore, repetitive descriptions are omitted here.

Figure 5A:
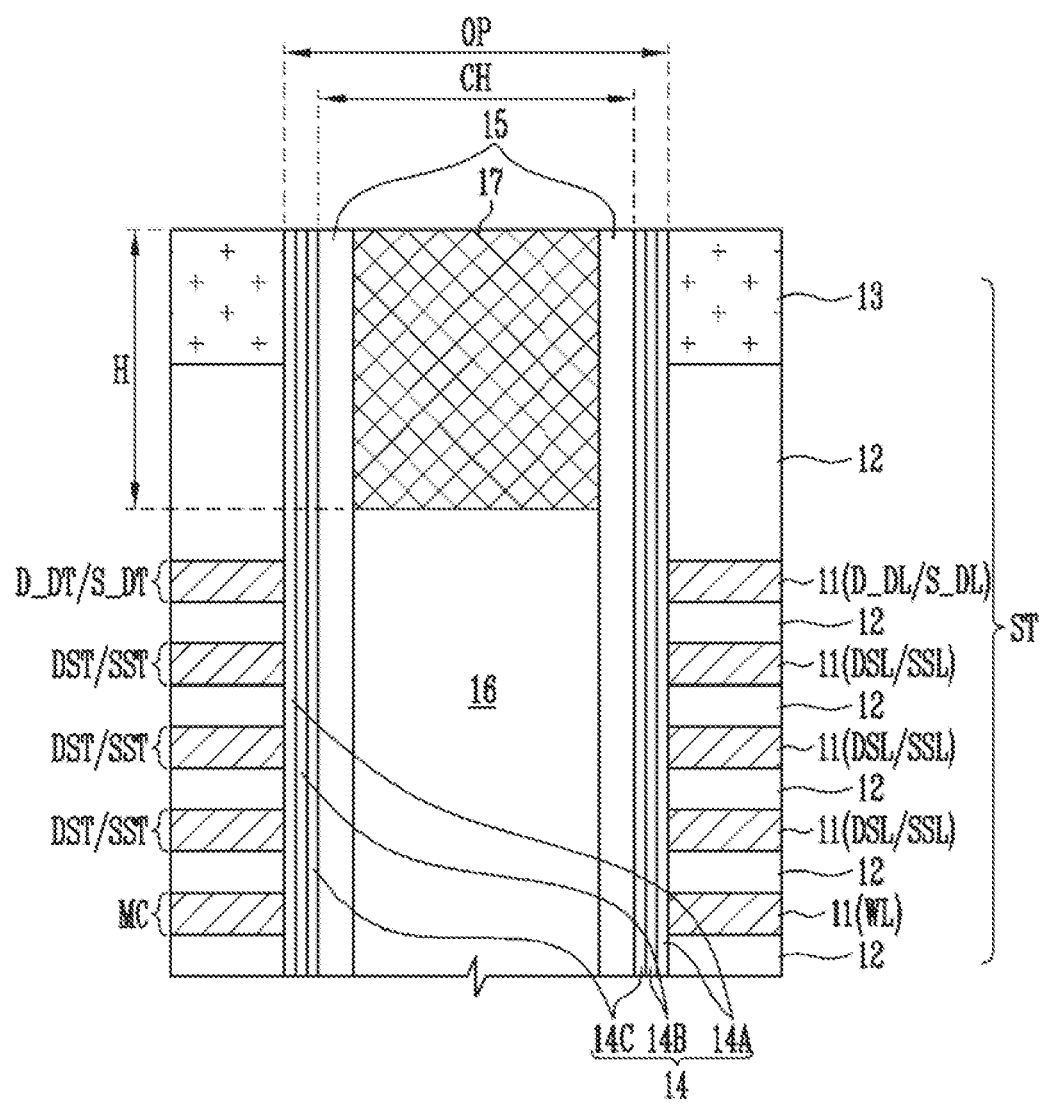
FIGS. 5A to 5C are cross-sectional diagrams illustrating a structure of a semiconductor device, according to an embodiment.
Figure 5B:
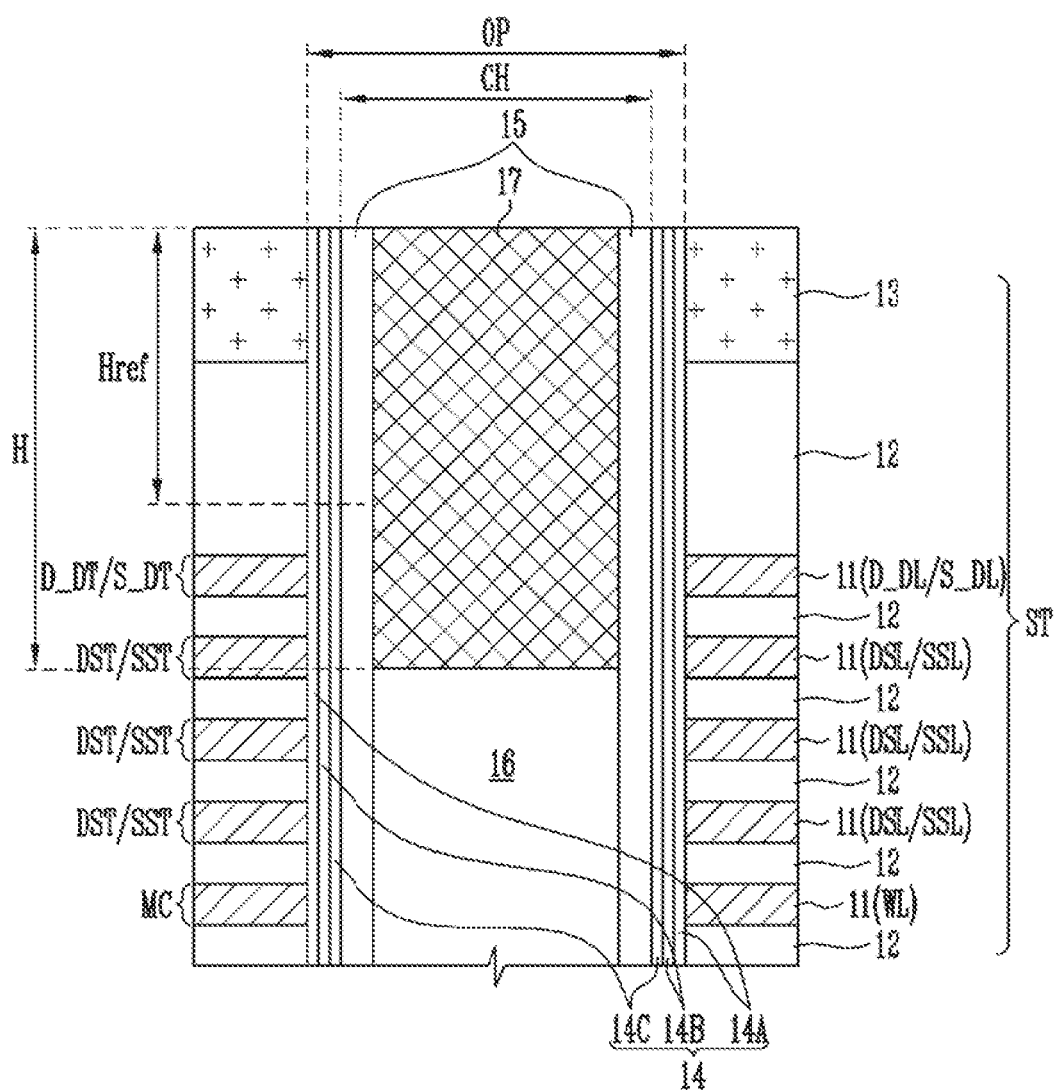
Figure 5C:
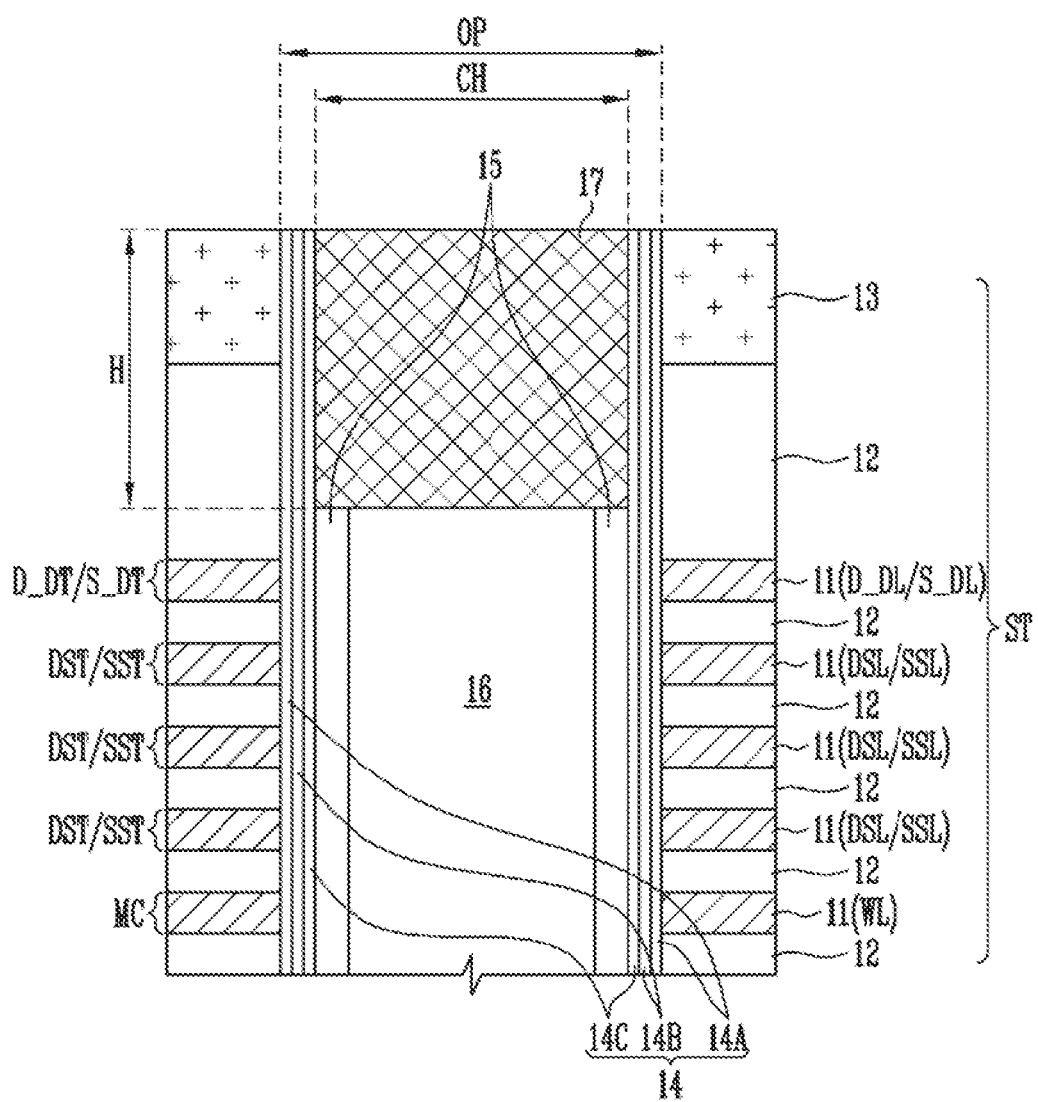

FIGS. 5A to 5C are cross-sectional diagrams illustrating the structure of a semiconductor device, according to an embodiment.

Referring to FIGS. 5A to 5C, a stacked structure ST may include conductive layers 11 and insulating layers 12 alternately stacked on each other and include a hard mask layer 13 at the uppermost level thereof. The hard mask layer 13 may include a nitride, carbon, and the like. In addition, the conductive layers 11 may include polysilicon, tungsten, metal, and the like.

The conductive layers 11 may be the word line WL, the drain select line DSL, the source select line SSL, the drain-side dummy line D_DL, or the source-side dummy line S_DL. For example, at least one select line DSL/SSL may be located over the word lines WL, and at least one dummy line D_DL/S_DL may be located over the select line DSL/SSL.

The stacked structure ST may include openings OP extending in a stacking direction. The stacking direction may be a direction in which the conductive layers 11 and the insulating layers 12 are stacked, or a vertical direction to a surface of a substrate (not illustrated).

Channel structures CH may be formed in the openings OP. In addition, a memory layer 14 may be interposed between the channel structure CH and the conductive layers 11. The memory layer 14 may enclose a sidewall of each of channel layers 15. In addition, the memory layer 14 may include at least one of a charge blocking layer 14A, a data storage layer 14B, and a tunnel insulating layer 14C. For example, the data storage layer 14B may include a floating gate, a charge trapping material, a variable resistance material, a nanostructure, and the like.

Each of the channel structures CH may include the channel layer 15, a gap-fill layer 16, and a pad 17. In other words, the channel layer 15, the gap-fill layer 16, and the pad 17 formed in a single opening OP may form a single channel structure CH. The gap-fill layer 16 may be formed in a space defined by the channel layer 15 and may include an insulating material.

The pad 17 may be located on the gap-fill layer 16, and each of the pad 17 and the gap-fill layer 16 may be coupled to the channel layer 15. Referring to FIGS. 5A and 5B, the pad 17 may be formed in the space defined by the channel layer 15 and a sidewall of the pad 17 may contact an inner wall of the channel layer 15. Referring to FIG. 5C, an upper surface of the channel layer 15 and an upper surface of the gap-fill layer 16 may be located at substantially the same level, and the pad 17 may be located above the channel layer 15 and the gap-fill layer 16. According to the embodiment shown in FIG. 5C, a lower surface of the pad 17 and the upper surface of the channel layer 15 may contact each other.

The pad 17 may have a higher impurity concentration than the channel layer 15. The pad 17 may include a P-type impurity or an N-type impurity. In addition, the channel layer 15 might not include an impurity or may include an impurity at a lower concentration than the pad 17. For example, the pad 17 may be a polysilicon layer doped with an N-type impurity at a high concentration, and the channel layer 15 may be an undoped polysilicon layer or a polysilicon layer doped with an N-type impurity at a low concentration.

According to this structure, the select transistor DST/SST may be located at an intersection of the channel layer 15 and the select line DSL/SSL, and the dummy transistor D_DT/S_DT may be located at an intersection of the channel layer 15 and the dummy line D_DL/S_DL. Accordingly, each of the memory strings may include the memory cells MC, at least one select transistor DST/SST, and at least one dummy transistor D_DT/S_DT stacked along the channel layer 15. In addition, the memory cells MC, the select transistors DST/SST, and the dummy transistors D_DT/S_DT included in the single memory string MS may share the channel structure CH.

Each of the memory cells MC may include the channel layer 15, the memory layer 14, and a gate electrode. In addition, the select transistor DST/SST and the dummy transistor D_DT/S_DT may have a similar structure to the memory cell MC. The dummy transistor D_DT/S_DT may include the channel layer 15, the memory layer 14, and the gate electrode, and the memory layer 14 may serve as an insulating layer.

Because the pad 17 includes an impurity having a higher concentration than the channel layer 15, the pad 17 may serve as a junction of the dummy transistor D_DT/S_DT or the select transistor DST/SST. In addition, when the impurity in the pad 17 diffuses into the channel layer 15, a region of the channel layer 15 into which the impurity diffuses may also serve as a junction along with the pad 17.

Accordingly, electrical characteristics of the memory string MS or the dummy transistors D_DT and S_DT may vary depending on a height H of a pad or a junction overlap of the channel structure CH, wherein the term the junction overlap may refers to a distance including the height of the pad 17 with or without the a junction formed in the channel structure CH. In other words, the junction overlap may refer to the height H of the pad, and may also include the region into which the impurity in the pad 17 diffuses along the channel layer 15.

Referring to FIGS. 5A and 5C, the lower surface of the pad 17 may be located at a higher level than an upper surface of the dummy line D_DL/S_DL. Alternatively, referring to FIG. 5B, the lower surface of the pad 17 may be located at a lower level than a lower surface of the dummy line D_DL/S_DL, and the pad 17 may overlap the dummy line D_DL/S_DL and the select line DSL/SSL. The channel structure CH shown in FIG. 5B may have a structure having a greater junction overlap and the greater height H of the pad 17 than the channel structure CH shown in each of FIGS. 5A and 5C.

Due to the difference in physical structure, the memory string corresponding to FIG. 5B and the memory string corresponding to each of FIGS. 5A and 5C may have different electrical characteristics from each other. For example, when a junction overlap of the channel structure CH is greater than a reference value Href as shown in FIG. 5B, the dummy transistor D_DT/S_DT or the select transistor DST/SST may have a lower threshold voltage than a reference value. A leakage current may be increased during a program operation, or an excessive Gate Induced Drain Leakage (GIDL) current, or Band to band tunneling (BTBT) current may be generated during an erase operation due to this lower threshold voltage. "A reference value" may refer to a target value at the time of designbut a junction overlap or a threshold voltage or the height H of the pad or the like may be different from a respective reference value due to processing limitations or the like.

Accordingly, according to an embodiment, when an erase operation, a program operation, or a read operation is performed, different levels of bias may be used depending on a threshold voltage of the dummy transistor D_DT/S_DT, the height H of the pad 17, or a junction overlap of the channel structure CH. Thereby, memory strings having different physical structures or different electrical characteristics may have uniform operational characteristics. For example, the dummy transistors D_DT/S_DT having different physical structures or different threshold voltages may have substantially the same operational characteristics as each other due to the different levels of bias.

FIG. 6 is a flowchart illustrating a method of adjusting bias of a semiconductor device, according to an embodiment.

Referring to FIG. 6, characteristics of the memory string MS may be checked S610. A physical structure such as a junction overlap and a height of a pad of the channel structure CH may be checked, or electrical characteristics such as a threshold voltage of the dummy transistor D_DT/S_DT or the select transistor DST/SST may be checked. For example, an amount of current flowing may be checked or a threshold voltage of the dummy transistor D_DT/S_DT and a threshold voltage of the select transistor DST/SST may be checked during a read operation. Thereby, a junction overlap and a height of a pad of a channel structure may be conjectured.

Subsequently, a bias level of an erase operation, a program operation, or a read operation may be adjusted S620 according to the checked characteristics of the memory string MS. A level of bias applied to the dummy line D_DL/S_DL coupled to the dummy transistor D_DT/S_DT may be adjusted. In addition, adjustment of a bias level may be performed on each of the memory strings, or on a memory block unit basis.

Bias applied to the dummy line D_DL/S_DL may have bias applied to the select line DSL/SSL as a default value, and a bias level may be adjusted by applying a positive offset or a negative offset to the default value depending on a threshold voltage of the dummy transistor D_DT/S_DT. For example, a bias level may be adjusted such that a level of bias applied to the dummy line D_DL/S_DL may be low when a threshold voltage of the dummy transistor D_DT/S_DT is low, and a level of bias applied to the dummy line D_DL/S_DL may be high when a threshold voltage of the dummy transistor D_DT/S_DT is high. A bias level may be adjusted such that a level of bias applied to the dummy line D_DL/S_DL may be low when a junction overlap of the channel structure CH is great, and a level of bias applied to the dummy line D_DL/S_DL may be high when a junction overlap of the channel structure CH is small. Alternatively, a bias level may be adjusted such that a level of bias applied to the dummy line D_DL/S_DL may be low when a height of the pad 17 is great, and a level of bias applied to the dummy line D_DL/S_DL may be high when a height of the pad 17 is small.

Table 1 shows a condition of a bias level used for an erase operation.

TABLE 1

|  | GIDL/Erase operation | Erase operation |
| --- | --- | --- |
| BL |  | Floating (~Vsource) |
| D_DL | 0 V ± a | Floating (Vers-$V_{GIDL}$) |
| DSL | 0 V | Floating (Vers-$V_{GIDL}$) |
| WL | Floating/Vpass/0 V | 0 V |
| SSL | 0 V | Floating (Vers-$V_{GIDL}$) |
| S_DL | 0 V ± a | Floating (Vers-$V_{GIDL}$) |
| SL | $V_{GIDL}$ | Vers (20 V) |

An erase operation may be performed by a Gate Induced Drain Leakage (GIDL) method. For example, an erase operation may be performed by generating a GIDL current using a GIDL voltage ($V_{GIDL}$) and then injecting a hole into a data storage layer of memory cells.

During a first period, the GIDL voltage ($V_{GIDL}$) may be applied to the source line SL and then a ground voltage (0V) may be applied to the drain select line DSL and the source select line SSL. A negative voltage may be applied to the drain select line DSL and the source select line SSL. The word lines WL may be floated, or a pass voltage (Vpass), or the ground voltage (0V) may be applied to the word lines WL. The bit line BL may be floated and a potential of the bit line BL may be increased to a source voltage (Vsource) by coupling. In addition, bias of adjusted level may be applied to the dummy line D_DL/S_DL. Subsequently, during a second period, a potential level of the source line SL may be increased to an erase voltage (Vers) and the drain select line DSL, the source select line SSL, and the dummy line D_DL/S_DL may be floated. A potential of lines floated by coupling may be increased to Vers-$V_{GIDL}$.

For example, when a height of the pad 17 or a junction overlap is equal to the reference value, a ground voltage (0V) may be applied to the dummy line D_DL/S_DL. When the height of the pad 17 or the junction overlap is greater than the reference value, bias to which a negative offset (−α) is applied (i.e., a negative voltage) may be applied to the dummy line D_DL/S_DL. In addition, when a threshold voltage of the dummy transistor D_DT/S_DT is smaller than the reference value, bias to which a negative offset (−α) is applied (i.e., a negative voltage) may be applied to the dummy line D_DL/S_DL. Thereby, excessive generation of a GIDL current may be prevented. Alternatively, a BTBT current may be decreased by forming a depletion region in a junction.

When the height of the pad 17 or the junction overlap is smaller than the reference value, bias to which a positive offset (+α) is applied (i.e., a positive voltage) may be applied to the dummy line D_DL/S_DL. In addition, when the threshold voltage of the dummy transistor D_DT/S_DT is greater than the reference value, bias to which a positive offset (+α) is applied (i.e., a positive voltage) may be applied to the dummy line D_DL/S_DL. Thereby, lack of a GIDL current may be prevented and a sufficient amount of GIDL current may be generated.

An erase voltage Vers may be applied to the bit line BL. In addition, when the memory string MS includes the pipe transistor PT, a turn-on voltage for turning on the pipe transistor PT may be applied to the pipe line PL.

Table 2 shows a condition of a bias level used for a program operation.

TABLE 2

|  | Program operation (Selected) | Program operation (Unselected) |
| --- | --- | --- |
| BL | 0 V | $V_{DD}$ (2.3 V) |
| D_DL | Von ± a | Voff ± a |
| DSL | Von (2.3 V) | Voff (0 V) |
| WL | Vpgm (20 V) | Vpass (8 V) |
| SSL | Voff (0 V) | Voff (0 V) |
| S_DL | Voff ± a | Voff ± a |
| SL | $V_{DD}$ (2.3 V) | |

During a program operation, a program permission voltage (0V) may be applied to the selected bit line BL, and a program inhibition voltage may be applied to the unselected bit line BL. The program inhibition voltage may be a power voltage ($V_{DD}$). A turn-on voltage (Von) for turning on the drain select transistor DST may be applied to the selected drain select line DSL, and a turn-off voltage (Voff) for turning off the drain select transistor DST may be applied to the unselected drain select line DSL. A program voltage (Vpgm) may be applied to the selected word line WL and a pass voltage (Vpass) may be applied to the unselected word line WL. The power voltage ($V_{DD}$) may be applied to the source line SL and a turn-off voltage (Voff) for turning off the source select transistor SST may be applied to the source select line SSL. In addition, bias of adjusted level may be applied to the dummy line D_DL/S_DL. As described above, a bias including a positive offset (+α) or a negative offset (−α) may be applied to the dummy line D_DL/S_DL, wherein the bias may be determined by adding/subtracting the offset to the voltage applied to the drain select line DSL or the source select line SSL, the offset depending on the height of the pad 17, the junction overlap, or the threshold voltage of the dummy transistor D_DT/S_DT.

For example, when a height of the pad 17 or a junction overlap is equal to the reference value, the turn-on voltage (Von) or the turn-off voltage (Voff) may be applied to the dummy line D_DL/S_DL. When the height of the pad 17 or the junction overlap is greater than the reference value, a turn-on voltage (Von-α) including a negative offset or a turn-off voltage (Voff-α) including a negative offset may be applied to the dummy line D_DL/S_DL. In addition, when a threshold voltage of the dummy transistor D_DT/S_DT is smaller than the reference value, a turn-on voltage (Von-α) including a negative offset or a turn-off voltage (Voff-α) including a negative offset may be applied to the dummy line D_DL/S_DL. Thereby, a leakage current may be decreased.

When the height of the pad 17 or the junction overlap is smaller than the reference value, a turn-on voltage (Von+α) including a positive offset or a turn-off voltage (Voff+α) including a positive offset may be applied to the dummy line D_DL/S_DL. In addition, when the threshold voltage of the dummy transistor D_DT/S_DT is greater than the reference value, a turn-on voltage (Von+α) including a positive offset is applied or a turn-off voltage (Voff+α) including a positive offset may be applied to the dummy line D_DL/S_DL.

Table 3 shows a condition of a bias level used for a read operation.

TABLE 3

| | Read operation (Selected) | Read operation (Unselected) |
|---|---|---|
| BL | Vbl (0.5 V) | |
| D_DL | Von ± a | Voff ± a |
| DSL | Von | Voff |
| WL | Vread | Vpass (7 V) |
| SSL | Von | Voff |
| S_DL | Von ± a | Voff ± a |
| SL | 0 V | |

During a read operation, the selected bit line BL or the unselected bit line BL may be charged with a bit line voltage (Vbl), a turn-on voltage (Von) may be applied to the selected drain select line DSL, and a turn-off voltage (Voff) may be applied to the unselected drain select line DSL. A ground voltage (0V) may be applied to the source line SL, the turn-on voltage (Von) may be applied to the selected source select line SSL, and the turn-off voltage (Voff) may be applied to the unselected source select line SSL. A read voltage (Vread) may be applied to the selected word line WL and a pass voltage (Vpass) may be applied to the unselected word line WL. The pass voltage (Vpass) may have a level to turn on a memory cell independent of a program state of the memory cell. As described above, bias including a positive offset (+α) or a negative offset (−α) may be applied to the dummy line D_DL/S_DL depending on the height of the pad 17, the junction overlap, or the threshold voltage of the dummy transistor D_DT/S_DT.

For example, when a height of the pad 17 or a junction overlap is equal to the reference value, the turn-on voltage (Von) and the turn-off voltage (Voff) may be applied to the dummy line D_DL/S_DL. When the height of the pad 17 or the junction overlap is greater than the reference value, a turn-on voltage (Von−α) including a negative offset or a turn-off voltage (Voff-α) including a negative offset may be applied to the dummy line D_DL/S_DL. When a threshold voltage of the dummy transistor D_DT/S_DT is smaller than the reference value, a turn-on voltage (Von-α) including a negative offset or a turn-off voltage (Voff-α) including a negative offset may be applied to the dummy line D_DL/S_DL.

When the height of the pad 17 or the junction overlap is smaller than the reference value, a turn-on voltage (Von+α) including a positive offset or a turn-off voltage (Voff+α) including a positive offset may be applied to the dummy line D_DL/S_DL. When the threshold voltage of the dummy transistor D_DT/S_DT is greater than the reference value, a turn-on voltage (Von+α) including a positive offset or a turn-off voltage (Voff+α) including a positive offset may be applied to the dummy line D_DL/S_DL.

The read operation may be a verify operation. For example, a read operation may be a verify operation entailed by an erase operation or a program operation. In addition, a level of bias applied to the select line DSL/SSL adjacent to the dummy line D_DL/S_DL may also be adjusted like that of the dummy line D_DL/S_DL.

In addition, it is assumed that the pad 17 includes an N-type impurity in this embodiment. When the pad 17 includes a P-type impurity, a negative offset (−α) and a positive offset (+α) may be applied in an opposite way. For example, when a height of the pad 17 or a junction overlap is greater than the reference value or a threshold voltage of the dummy transistor D_DT/S_DT is smaller than the reference value, bias including a positive offset (+α) may be applied to the dummy line D_DL/S_DL. In addition, when the height of the pad 17 or the junction overlap is smaller than the reference value or the threshold voltage of the dummy transistor D_DT/S_DT is greater than the reference value, bias including a negative offset (−α) may be applied to the dummy line D_DL/S_DL.

FIGS. 7A to 7F are cross-sectional diagrams illustrating a method of manufacturing a semiconductor device according to an embodiment.

Figure 7A:
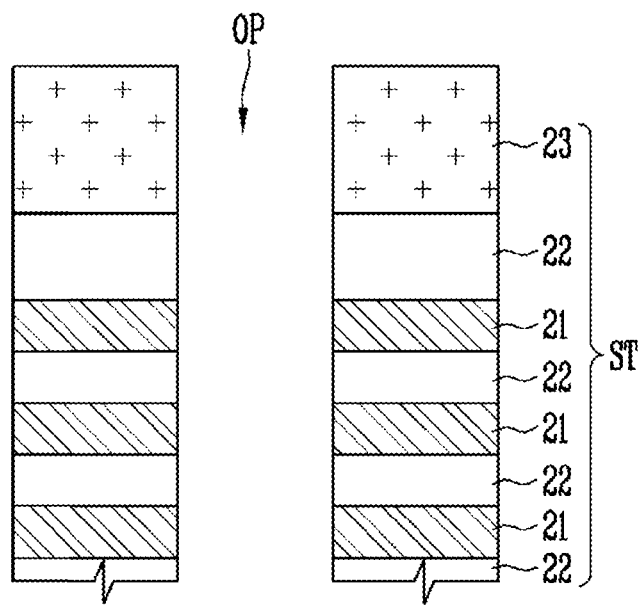
FIGS. 7A to 7F are cross-sectional diagrams illustrating a method of manufacturing a semiconductor device, according to an embodiment.

Referring to FIG. 7A, the stacked structure ST may be formed. The stacked structure ST may include first material layers 21 and second material layers 22 alternately stacked on each other. In addition, the stacked structure ST may include a hard mask layer 23 at the uppermost level thereof. The first material layers 21 may be provided to form gate electrodes of memory cells, select transistors, dummy transistors, and the like. The second material layers 22 may be provided to insulate the stacked gate electrodes from each other. The hard mask layer and the first material layers 21 may include the same materials.

The first material layers 21 may include a material having high etch selectivity with respect to the second material layers 22. That is to say, the first material layers 21 may have a high etch rate as compared to the etch rate of the second material layers 22. For example, each of the first material layers 21 may be a sacrificial layer including a nitride and each of the second material layers 22 may be an insulating layer including an oxide. Alternatively, each of the first material layers 21 may be a conductive layer including polysilicon and tungsten, and each of the second material layers 22 may be an insulating layer including an oxide. In another example, each of the first material layers 21 may be a conductive layer including doped polysilicon, and each of the second material layers 22 may be a sacrificial layer including undoped polysilicon.

Subsequently, the openings OP passing through the stacked structure ST may be formed. A width of each of the openings OP may be uniform throughout the opening OP, or each of the openings OP may have a width that decreases from an upper portion toward a lower portion thereof.

Figure 7B:
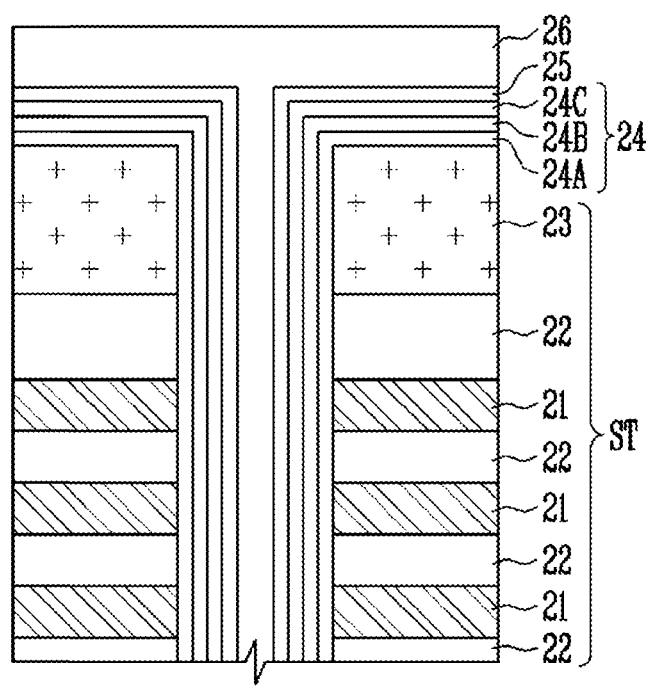

Referring to FIG. 7B, a memory layer 24 may be formed in each of the openings OP. For example, a charge blocking layer 24A, a data storage layer 24B, and a tunnel insulating layer 24C may be sequentially formed. The memory layer 24 may be conformally formed along an inner surface of each of the openings OP, and on an upper surface of the stacked structure ST.

Subsequently, a channel layer 25 may be formed in each of the openings OP. The channel layer 25 may be formed on the memory layer 24 and over the upper surface of the stacked structure ST.

Subsequently, a gap-fill layer 26 may be formed in each of the openings OP. The gap-fill layer 26 may completely fill each of the openings OP. In addition, the gap-fill layer 26 may be formed over the upper surface of the stacked structure ST. Although not illustrated in FIG. 7B, the gap-fill layer 26 may include a void.

Figure 7C:
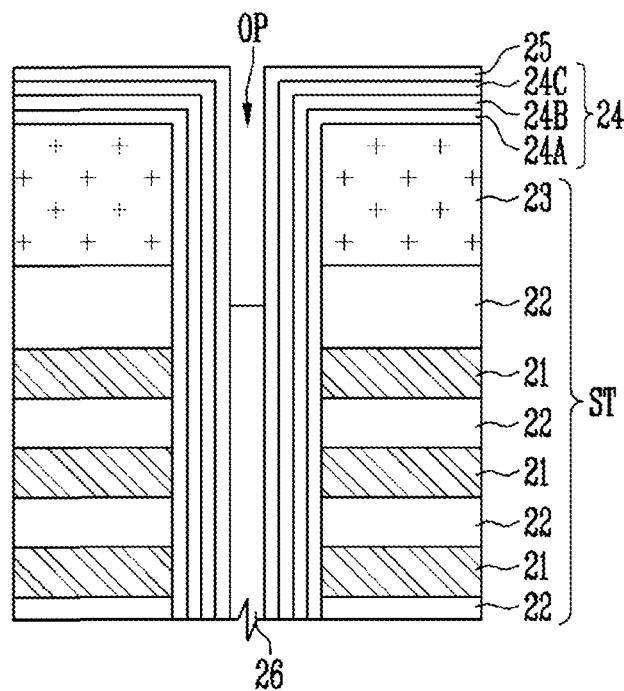

Referring to FIG. 7C, the gap-fill layer 26 may be etched. A portion of the opening OP may be opened again by etching. A pad may be formed at a region of the opening OP which is opened again, during a subsequent process.

Accordingly, a height of the pad may be determined according to a depth to which the gap-fill layer 26 is etched. The channel layer 25 may also be etched when the gap-fill layer 26 is etched. According to this embodiment, an upper surface of the gap-fill layer 26 and an upper surface of the channel layer 25 may be located at substantially the same level.

Figure 7D:
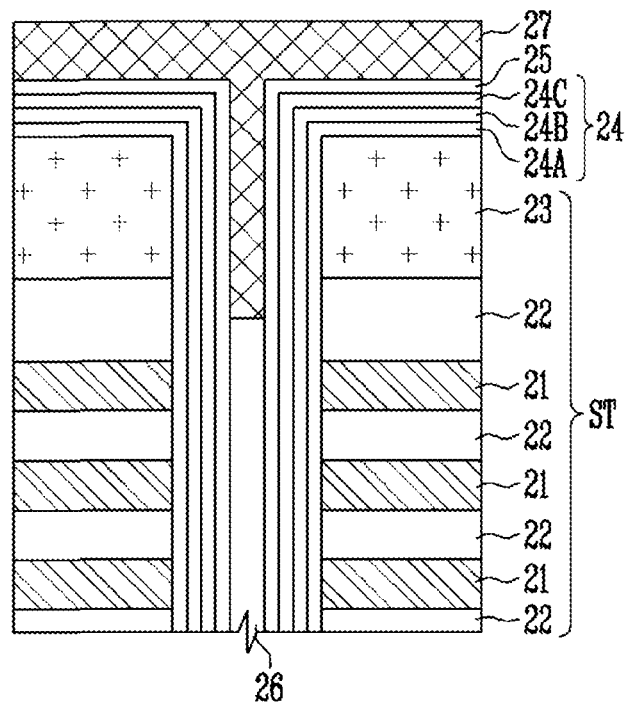

Referring to FIG. 7D, a pad layer 27 may be formed in the region which is formed by etching the gap-fill layer 26, that is, the opening OP which is opened again. The pad layer 27 may also be formed over the upper surface of the stacked structure ST. The pad layer 27 may be formed by doping an impurity by an in-situ method, or an impurity may be doped after the pad layer 27 is formed.

Figure 7E:
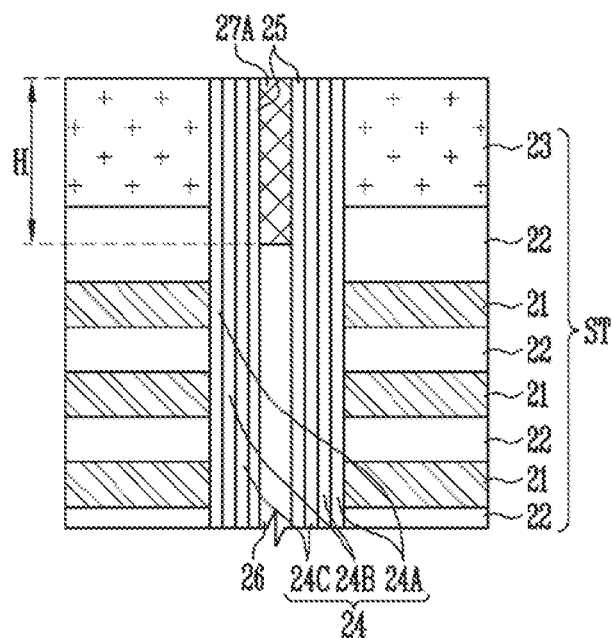

Referring to FIG. 7E, the pad layer 27, the channel layer 25, and the memory layer 24 may be planarized until the upper surface of the stacked structure ST is exposed. For example, a planarizing process may be performed by a Chemical Mechanical Polishing (CMP) process. Thereby, a pad 27A may be formed.

Figure 7F:
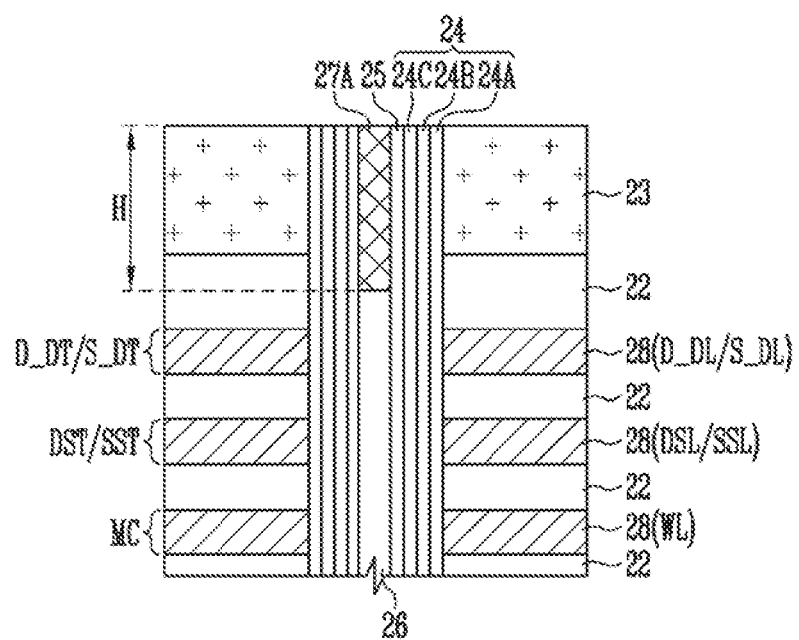

Referring to FIG. 7F, the first material layers 21 or the second material layers 22 may be replaced by third material layers 28. For example, when the first material layers 21 are sacrificial layers and the second material layers 22 are insulating layers, the third material layers 28 may be conductive layers. Alternatively, when the first material layers 21 are conductive layers and the second material layers 22 are insulating layers, the third material layers 28 may be silicide layers. In another example, when the first material layers 21 are conductive layers and the second material layers 22 are sacrificial layers, the second material layers 22 may be replaced by insulating layers.

Accordingly, the memory cells MC, at least one select transistor DST/SST, and at least one dummy transistor D_DT/S_DT stacked along the channel layer 25 may be formed.

A height of the each of the pads 27A, a junction overlap may be different from the reference value or might not be uniform due to limitations of a manufacturing process. Accordingly, characteristics of the memory strings MS may be checked and a correct operation may be performed according to the characteristics. For example, checking the characteristics and correcting may be performed when testing a wafer.

First, physical or electrical characteristics of the memory strings MS may be checked.

For example, an amount of current during a read operation may be measured, such that a height of the pad 27A or a junction overlap may be conjectured. Variations in current according to variations in level of bias applied to the dummy line D_DL/S_DL may be measured. Referring to Table 4, a bit line voltage (Vbl) may be applied to the bit line BL, a pass voltage (Vpass) may be applied to the word line WL, a turn-on voltage (for example, a voltage of 4.5V) may be applied to the drain select line DSL and the source select line SSL, and a ground voltage (0V) may be applied to the source line SL. In addition, an amount of current may be measured while the voltage applied to the drain-side dummy line D_DL is changed to 4V/5V/6V/7V/8V.

TABLE 4

| Bit line BL | Vbl (0.5 V) |
| Drain-side dummy line D_DL | Split (4 V/5 V/6 V/7 V/8 V) |
| Drain select line DSL | Von (4.5 V) |
| Word line WL | Vpass (7 V) |
| Source select line SSL | Von (4.5 V) |
| Source line SL | 0 V |

Because the drain-side dummy transistor D_DT is turned on or turned off according to variations in level of bias, a height of the pad 27A or a junction overlap may be conjectured by the time when the drain-side dummy transistor D_DT is turned on. For example, it may be determined that the height of the pad 27A or the junction overlap may be great when a bias level at which the drain-side dummy transistor D_DT is turned on is low. Alternatively, the height of the pad 27A or the junction overlap may be conjectured by variations in amount of current according to variations in bias level. For example, it may be determined that a slope of a current may be great when variations in current according to variations in bias level are great, and the height of the pad 27A or the junction overlap may be great when the slope of the current is great.

Although an example in which the memory string includes the drain-side dummy transistor D_DT is shown in Table 4, it may also be applied to an example in which the memory string includes the source-side dummy transistor S_DT. To measure characteristics of the source-side dummy transistor S_DT, an amount of current may be measured while a turn-on voltage of 7V is applied to the source select line SSL and a voltage applied to the source-side dummy line S_DL is changed to 7V/8V/9V/10V.

In another example, which has similar conditions shown in Table 4, a reference voltage (for example, a voltage of 7V) may be applied to the drain select line DSL, and an amount of current flowing may be compared to the reference value. It may be determined that the height of the pad 27A or the junction overlap is small when the amount of current is smaller than the reference value. Alternatively, it may be determined that the height of the pad 27A or the junction overlap is great when the amount of current is greater than the reference value. The reference value may be an amount of current flowing when the reference voltage (for example, a voltage of 7V) is applied to the drain select line DSL, if the height of the pad 27A or the junction overlap corresponds to a target value at the time of design.

Although an example in which the memory string includes the drain-side dummy transistor D_DT is shown in Table 4, it may also be applied to an example in which the memory string includes the source-side dummy transistor S_DT. To measure characteristics of the source-side dummy transistor S_DT, a reference voltage (for example, a voltage of 7V) may be applied to the source select line SSL, and an amount of current flowing may be compared to the reference value.

In another example, the height of the pad 27A or the junction overlap may be conjectured by measuring threshold voltages of the dummy transistor D_DT/S_DT and the select transistor DST/SST adjacent thereto. Table 5 shows an example in which, when a single memory string includes three drain select transistors DST0, DST1, and DST2 and one drain-side dummy transistor D_DT, and the dummy select transistors DST0, DST1, and DST2 and the drain-side dummy transistor D_DT are sequentially stacked, a threshold voltage of each of the drain-side dummy transistor D_DT and the drain select transistors DST0, DST1, and DST2 is measured.

TABLE 5

|      | Threshold voltage |
|------|-------------------|
| D_DT | −2 V              |
| DST2 | −0.1 V            |
| DST1 | 0 V               |
| DST0 | 0.2 V             |

A variation in threshold voltage between the drain-side dummy transistor D_DT and the drain select transistors DST0, DST1, and DST2 may be checked based on the measured values. According to the manufacturing process described above, the drain-side dummy transistor D_DT and the drain select transistors DST0, DST1, and DST2 may have substantially the same structure, but may have different junctions, respectively. In other words, the threshold voltage of each of the transistors may vary according to the height of the pad 27A or the junction overlap of the channel structure. For example, when the height of the pad 27A or the junction overlap is great, the threshold voltage of the transistor may be low. Accordingly, the height of the pad 27A or the junction overlap may be conjectured by analyzing a tendency of variations in threshold voltage of each of the transistors D_DT, DST0, DST1, and DST2 by inversely estimating the values.

For example, it is assumed that a target threshold voltage of the drain-side dummy transistor D_DT is 0V. Because a threshold voltage of the drain-side dummy transistor D_DT shown in Table 5 is −2V, the drain-side dummy transistor D_DT may have a lower threshold voltage than the target threshold voltage. Accordingly, it may be determined that the height of the pad 27A and the junction overlap are great. In addition, because the drain select transistor DST1 has a threshold voltage of 0V, it may be determined that the pad 27A or the junction overlap may have a depth corresponding to a depth of the drain select transistor DST1.

The height of the pad 27A or the junction overlap may be conjectured by combining the embodiments described above.

Subsequently, a bias level of an erase operation, a program operation, or a read operation may be adjusted using the conjectured height of the pad 27A or junction overlap. The bias level may be adjusted by the method described with reference to FIG. 6. For example, a level of bias applied to the dummy line D_DL/S_DL may be low when the height of the pad 27A or the junction overlap is great, and a level of bias applied to the dummy line D_DL/S_DL may be great when the height of the pad 27A or the junction overlap is small. Subsequently, the adjusted bias value may be stored in a fuse circuit, a memory cell, and the like.

Alternatively, the dummy transistors D_DT/S_DT may be programmed at different degrees by using the conjectured height of the pad 27A or junction overlap. For example, the dummy transistors D_DT/S_DT may be programmed to increase the threshold voltage thereof when the height of the pad 27A or the junction overlap is greater than the reference value. In addition, the dummy transistors D_DT/S_DT may be negatively programmed to decrease the threshold voltage thereof when the height of the pad 27A or the junction overlap is smaller than the reference value.

The height of the pad 27A or the junction overlap may be conjectured again after the bias is adjusted. The bias may then be adjusted again according to a result of conjecture. For example, the bias may be adjusted by a method of measuring a current, and may then be adjusted again by a method of measuring a threshold voltage.

According to the manufacturing method as described above, a semiconductor device having uniform operational characteristics may be provided by a correct operation even when the memory strings MS have different pads 27A or junction overlaps from each other.

Figure 8:
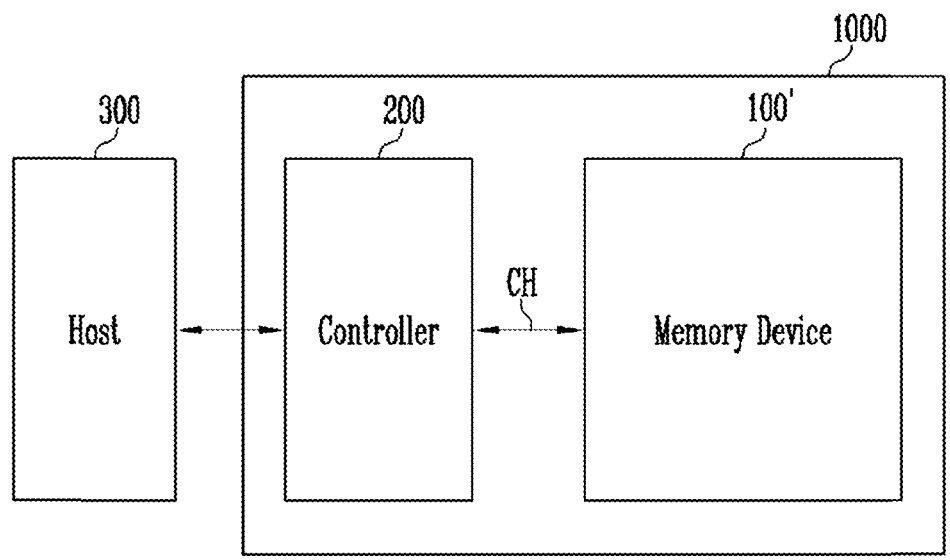
FIG. 8 is a block diagram illustrating a configuration of a memory system, according to an embodiment.

FIG. 8 is a block diagram illustrating a configuration of a memory system 1000, according to an embodiment. Referring to FIG. 8, the memory system 1000 may include a memory device 100' and a controller 200.

The controller 200 may control the memory device 100' through a channel CH and the memory device 100' may operate in response to control of the controller 200. The memory device 100' may include a memory cell array including a plurality of memory blocks. According to an embodiment, the memory device 100' may be the semiconductor device 100, described above, or a flash memory device.

The controller 200 may control the memory device 100' in response to a request from a host 300. In addition, the memory device 100' may receive a command and an address from the controller 200 through the channel CH and access an area selected from the memory cell array in response to the address. In other words, the memory device 100' may perform an internal operation corresponding to a command on the area selected by the address.

In addition, the controller 200 may control the memory device 100' to perform a program operation, a read operation, or an erase operation. During the program operation, the controller 200 may provide a program command, an address, and data to the memory device 100' through the channel CH, and the memory device 100' may program the area selected by the address with data. During the erase operation, the controller 200 may provide an erase command and an address to the memory device 100' through the channel CH, and the memory device 100' may erase data stored in the area selected by the address. During the read operation, the controller 200 may provide a read command and an address to the memory device 100' through the channel CH and the memory device 100' may read data from the area selected by the address. This read operation may include a read operation serving as verification entailed by a program or erase operation as well as a read operation performed to read and output data stored in a memory cell.

Figure 9:
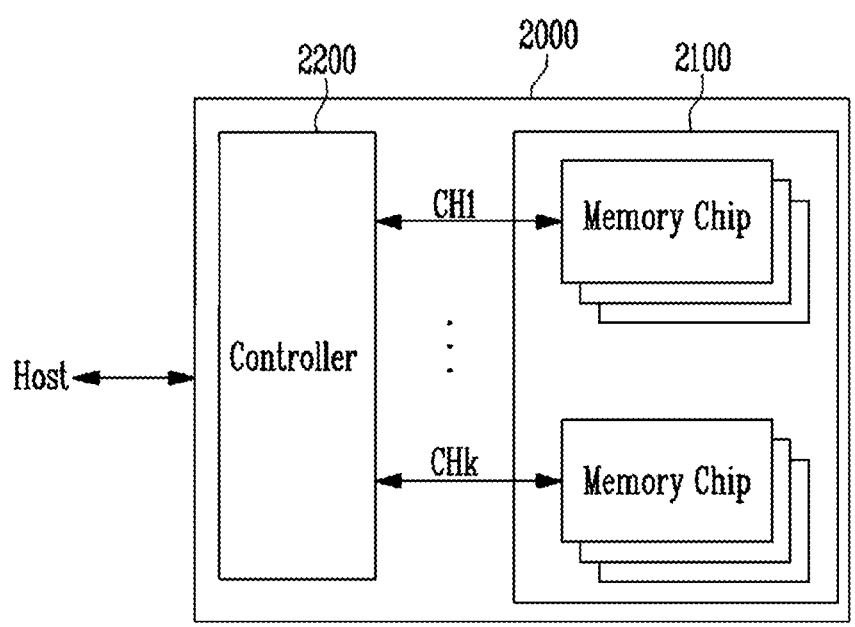
FIG. 9 is a block diagram illustrating a configuration of a memory system, according to an embodiment.

FIG. 9 is a block diagram illustrating a configuration of a memory system 2000, according to an embodiment. Referring to FIG. 9, the memory system 2000 may include a memory device 2100 and a controller 2200.

The memory device 2100 may be a semiconductor device and include a plurality of memory chips. The plurality of memory chips may be divided into a plurality of groups. The plurality of groups may communicate with the controller 2200 through first to kth channels CH1 to CHk, respectively. Each of the memory chips may be configured and operated in a similar manner to the semiconductor device 100 described above with reference to FIG. 1.

Each group may be configured to communicate with the controller 2200 through a single common channel. The controller 2200 may be configured in substantially the same manner as the controller 200 described with reference to FIG. 8, and configured to control the plurality of memory chips of the memory device 2100 through the plurality of channels CH1 to CHk. The memory system 2000 may be modified so that a single memory chip may be coupled to a single channel.

The controller 2200 and the memory device 2100 may be integrated into a semiconductor device. According to an embodiment, the controller 2200 and the memory device 2100 may be integrated into a single semiconductor device to form a memory card. For example, the controller 2200 and the memory device 2100 may be integrated into a single semiconductor device and form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 2200 and the memory device 2100 may be integrated into a single semiconductor device to form a Solid State Drive (SSD). The SSD may include a storage device for storing data in a memory. When the memory system 2000 serves as an SSD, operational rates of the host Host coupled to the memory system 2000 may be significantly improved.

In another example, the memory system 2000 may be provided as one of various elements of an electronic device such as a computer, an Ultra Mobile PC (UMPC), a workstation, a net-book, Personal Digital Assistants (PDAs), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or one of various elements for forming a computing system.

Figure 10:
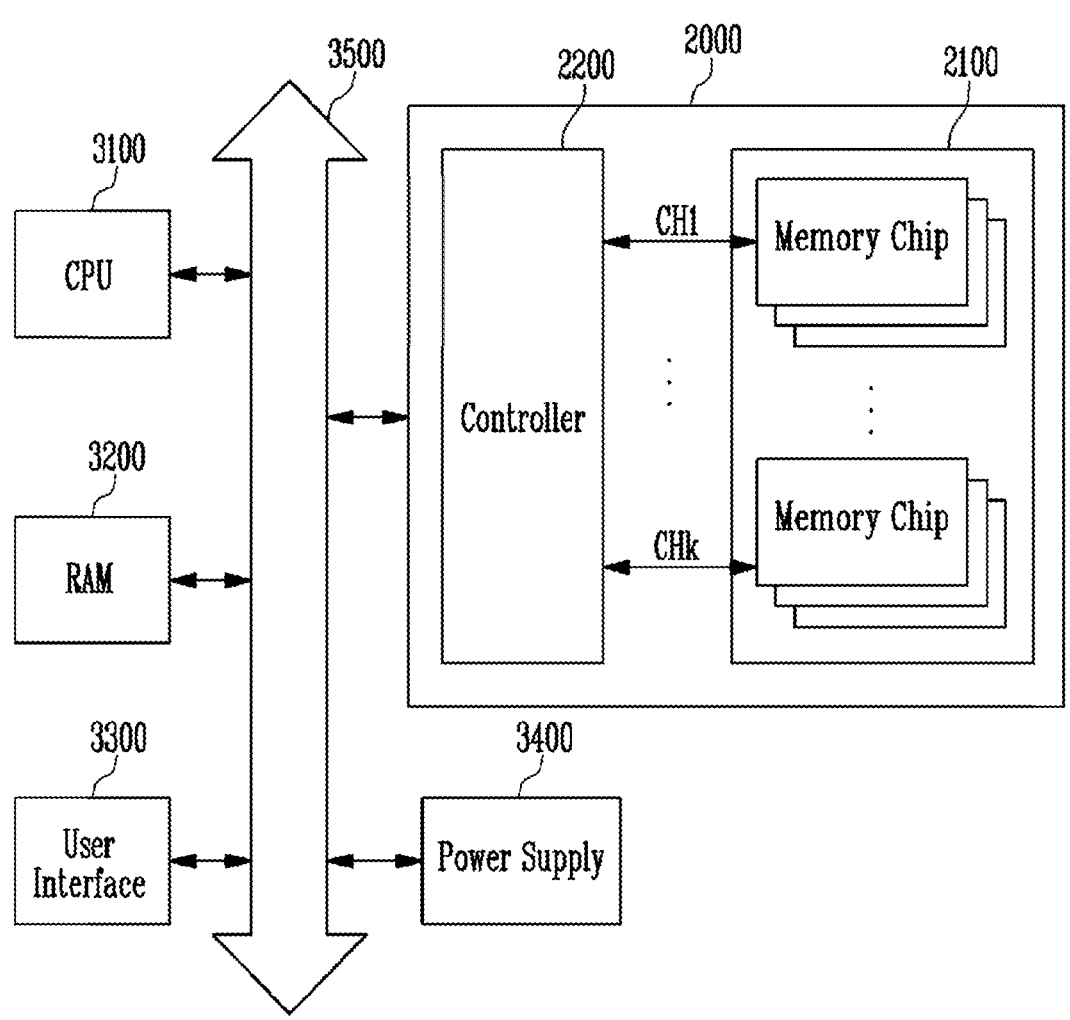
FIG. 10 is a block diagram illustrating a configuration of a computing system, according to an embodiment.

FIG. 10 is a block diagram illustrating a configuration of a computing system 3000 according to an embodiment. Referring to FIG. 10, the computing system 3000 may include a central processing unit 3100, Random Access Memory (RAM) 3200, a user interface 3300, a power supply 3400, a system bus 3500, and the memory system 2000.

The memory system 2000 may be electrically coupled to the central processing unit 3100, the RAM 3200, the user interface 3300, and the power supply 3400 through the system bus 3500. Data provided through the user interface 3300 or data processed by the central processing unit 3100 may be stored in the memory system 2000.

The memory device 2100 may be coupled to the system bus 3500 through the controller 2200, or directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 described with reference to FIG. 9 or the memory system 1000 described with reference to FIG. 8. In addition, the computing system 3000 may include both of the memory systems 1000 and 2000 described above with reference to FIGS. 8 and 9.

Some embodiments of the present disclosure relate to a semiconductor device having improved operational characteristics and reliability. Further, additional embodiments relate to a manufacturing method of such a semiconductor device.

Examples have been disclosed herein, and although specific terms are employed, various changes in form and detail may be made to the above-described examples without departing from the spirit and scope of the present disclosure. Accordingly, it will be understood by those skilled in the art that the scope of the present disclosure should not be limited to the above-described examples but should instead extend to cover the scope of the following claims and their equivalents.

What is claimed is:

1. A semiconductor device comprising:
   a bit line;
   a source line;
   a plurality of memory strings coupled between the bit line and the source line, wherein each of the plurality of memory strings comprises:
      at least one drain select transistor;
      a plurality of memory cells;
      at least one source select transistor; and
      a dummy transistor coupled between the bit line and the drain select transistor or between the source line and the source select transistor;
   a peripheral circuit configured to perform an erase operation, a program operation or a read operation on the memory strings by applying bias to dummy lines coupled to dummy transistors of the memory strings; and
   a control logic configured to control the peripheral circuit, wherein the control logic is configured to control the peripheral circuit such that the bias varies according to threshold voltages of the dummy transistors.

2. The semiconductor device of claim 1, wherein the memory strings include a first memory string having a first dummy transistor with a first threshold voltage and a second memory string having a second dummy transistor with a second threshold voltage lower than the first threshold voltage, and
   wherein the control logic is configured to control the peripheral circuit such that bias applied to a second dummy line coupled to the second dummy transistor is lower than bias applied to a first dummy line coupled to the first dummy transistor.

3. The semiconductor device of claim 1, wherein the memory strings include a first memory string having a first dummy transistor with a first threshold voltage and a second memory string having a second dummy transistor with a second threshold voltage higher than the first threshold voltage, and
wherein the control logic is configured to control the peripheral circuit such that bias applied to a second dummy line coupled to the second dummy transistor is higher than bias applied to a first dummy line coupled to the first dummy transistor.

4. The semiconductor device of claim 1, wherein, during an erase operation:
a ground voltage is applied to a dummy line coupled to the dummy transistor when a threshold voltage of the dummy transistor is equal to a reference value;
a positive voltage is applied to the dummy line coupled to the dummy transistor when the threshold voltage of the dummy transistor is greater than the reference value; and
a negative voltage is applied to the dummy line coupled to the dummy transistor when the threshold voltage of the dummy transistor is lower than the reference value.

5. The semiconductor device of claim 1, wherein, during a program operation:
a turn-on voltage, not including an offset, is applied to a dummy line coupled to the dummy transistor when a threshold voltage of the dummy transistor is equal to a reference value;
a turn-on voltage, including a positive offset, is applied to the dummy line coupled to the dummy transistor when the threshold voltage of the dummy transistor is greater than the reference value; and
a turn-on voltage, including a negative offset, is applied to the dummy line coupled to the dummy transistor when the threshold voltage of the dummy transistor is lower than the reference value.

6. The semiconductor device of claim 1, wherein, during a read operation:
a turn-on voltage or a turn-off voltage, not including an offset, is applied to a dummy line coupled to the dummy transistor when a threshold voltage of the dummy transistor is equal to a reference value;
a turn-on voltage or a turn-off voltage, including a positive offset, is applied to the dummy line coupled to the dummy transistor when the threshold voltage of the dummy transistor is greater than the reference value, and
a turn-on voltage or a turn-off voltage, including a negative offset, is applied to the dummy line coupled to the dummy transistor when the threshold voltage of the dummy transistor is lower than the reference value.

7. The semiconductor device of claim 6, wherein the read operation is a verify operation.

8. A semiconductor device comprising:
a bit line;
a source line;
a plurality of memory strings coupled between the bit line and the source line, wherein each of the plurality of memory strings comprises:
at least one drain select transistor;
a plurality of memory cells;
at least one source select transistor; and
a dummy transistor coupled between the bit line and the at least one drain select transistor or between the source line and the source select transistor;

a peripheral circuit configured to perform an erase operation, a program operation or a read operation on the memory strings by applying bias to dummy lines coupled to dummy transistors of the memory strings; and
a control logic configured to control the peripheral circuit, wherein the control logic is configured to control the peripheral circuit such that the bias varies according to junction overlaps of channel structures included in the memory strings.

9. The semiconductor device of claim 8, wherein the memory strings include a first memory string having a first channel structure with a first junction overlap and a second memory string having a second channel structure with a second junction overlap greater than the first junction overlap, and
wherein the control logic is configured to control the peripheral circuit such that bias applied to a second dummy line coupled to a dummy transistor of the second memory string is lower than bias applied to a first dummy line coupled to a dummy transistor of the first memory string.

10. The semiconductor device of claim 8, wherein the memory strings include a first memory string having a first channel structure with a first junction overlap and a second memory string having a second channel structure with a second junction overlap smaller than the first junction overlap, and
wherein the control logic is configured to control the peripheral circuit such that bias applied to a second dummy line coupled to a dummy transistor of the second memory string is higher than bias applied to a first dummy line coupled to a dummy transistor of the first memory string.

11. The semiconductor device of claim 8, wherein, during an erase operation:
a ground voltage is applied to a dummy line coupled to the dummy transistor when a threshold voltage of the dummy transistor is equal to a reference value;
a positive voltage is applied to the dummy line coupled to the dummy transistor when the threshold voltage of the dummy transistor is greater than the reference value; and
a negative voltage is applied to the dummy line coupled to the dummy transistor when the threshold voltage of the dummy transistor is lower than the reference value.

12. The semiconductor device of claim 8, wherein, during a program operation:
a turn-on voltage, not including an offset, is applied to a dummy line coupled to the dummy transistor when a threshold voltage of the dummy transistor is equal to a reference value;
a turn-on voltage, including a positive offset, is applied to the dummy line coupled to the dummy transistor when the threshold voltage of the dummy transistor is greater than the reference value; and
a turn-on voltage, including a negative offset, is applied to the dummy line coupled to the dummy transistor when the threshold voltage of the dummy transistor is lower than the reference value.

13. The semiconductor device of claim 8, wherein, during a read operation:
a turn-on voltage or a turn-off voltage, not including an offset, is applied to a dummy line coupled to the dummy transistor when a threshold voltage of the dummy transistor is equal to a reference value, a turn-on voltage or a turn-off voltage, including a positive offset, is applied to the dummy line coupled to the dummy transistor when the threshold voltage of the dummy transistor is greater than the reference value, and a turn-on voltage or a turn-off voltage, including a negative offset, is applied to the dummy line coupled to the dummy transistor when the threshold voltage of the dummy transistor is lower than the reference value.

14. The semiconductor device of claim 13, wherein the read operation is a verify operation.

15. A semiconductor device comprising:

stacked structures each including word lines, at least one select line stacked over the word lines, and at least one dummy line stacked over the at least one select line;

openings passing through the stacked structures;

channel layers formed in the openings;

pads formed in the openings, wherein the pads are coupled to the channel layers, respectively;

a peripheral circuit configured to apply bias to dummy lines during an erase operation, a program operation, or a read operation; and a control logic configured to control the peripheral circuit such that the bias varies depending on heights of the pads.

16. The semiconductor device of claim 15, wherein the pads include a first pad having a first height and a second pad having a second height greater than the first height, and wherein the control logic is configured to control the peripheral circuit such that bias applied to a dummy line corresponding to the second pad is lower than bias applied to a dummy line corresponding to the first pad.

17. The semiconductor device of claim 15, wherein the pads include a first pad having a first height and a second pad having a second height smaller than the first height, and wherein the control logic is configured to control the peripheral circuit such that bias applied to a dummy line corresponding to the second pad is higher than bias applied to a dummy line corresponding to the first pad.

18. The semiconductor device of claim 15, wherein the pads have a higher impurity concentration than the channel layers.

* * * * *